United States Patent
Ashimine

(10) Patent No.: US 9,633,795 B2
(45) Date of Patent: Apr. 25, 2017

(54) ELECTRONIC COMPONENT AND METHOD FOR MANUFACTURING ELECTRONIC COMPONENT

(71) Applicant: Murata Manufacturing Co., Ltd., Nagaokakyo-shi, Kyoto-fu (JP)

(72) Inventor: Tomoyuki Ashimine, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 0 days.

(21) Appl. No.: 15/209,957

(22) Filed: Jul. 14, 2016

(65) Prior Publication Data

US 2016/0322166 A1    Nov. 3, 2016

Related U.S. Application Data

(63) Continuation of application No. PCT/JP2015/072448, filed on Aug. 7, 2015.

(30) Foreign Application Priority Data

Aug. 18, 2014 (JP) ................. 2014-165801

(51) Int. Cl.
| | |
|---|---|
| *H01C 1/02* | (2006.01) |
| *H01G 7/06* | (2006.01) |
| *C23C 14/20* | (2006.01) |
| *H01C 7/00* | (2006.01) |
| *H01L 21/822* | (2006.01) |
| *H01L 23/522* | (2006.01) |

(Continued)

(52) U.S. Cl.
CPC ............ *H01G 7/06* (2013.01); *C23C 14/20* (2013.01); *C23C 14/5806* (2013.01); *H01C 7/00* (2013.01); *H01L 21/768* (2013.01); *H01L 21/822* (2013.01); *H01L 23/49822* (2013.01); *H01L 23/522* (2013.01); *H01L 23/5228* (2013.01); *H01L 27/04* (2013.01); *H01L 2924/0002* (2013.01)

(58) Field of Classification Search
CPC ........ H01C 7/00; H01L 21/768; H01L 21/822
USPC .......................................................... 338/252
See application file for complete search history.

(56) References Cited

U.S. PATENT DOCUMENTS

| | | | | |
|---|---|---|---|---|
| 4,182,781 | A * | 1/1980 | Hooper | H01L 24/11 |
| | | | | 205/126 |
| 4,298,505 | A * | 11/1981 | Dorfeld | C22C 19/05 |
| | | | | 252/512 |

(Continued)

FOREIGN PATENT DOCUMENTS

| | | |
|---|---|---|
| JP | H06112613 A | 4/1994 |
| JP | H1092602 A | 4/1998 |

(Continued)

OTHER PUBLICATIONS

International Search Report issued for PCT/JP2015/072448, date of mailing Oct. 27, 2015.

(Continued)

*Primary Examiner* — Kyung Lee
(74) *Attorney, Agent, or Firm* — Arent Fox LLP

(57) ABSTRACT

An electronic component that includes a resistive element. A Ni concentration of a resistive thin film of the resistive element at a side where there is a connection interface with a connection electrode is higher than the concentration of Ni at the side opposite to the interface.

18 Claims, 2 Drawing Sheets

(51) Int. Cl.
   *H01L 21/768*   (2006.01)
   *H01L 27/04*    (2006.01)
   *C23C 14/58*    (2006.01)
   *H01L 23/498*   (2006.01)

(56) References Cited

U.S. PATENT DOCUMENTS

| | | | | |
|---|---|---|---|---|
| 4,313,338 A | * | 2/1982 | Abe | G01N 27/12 338/34 |
| 4,591,821 A | * | 5/1986 | Paulson | H01C 17/12 118/715 |
| 5,235,313 A | * | 8/1993 | Narizuka | B41J 2/33515 204/192.1 |
| 5,469,131 A | | 11/1995 | Takahashi et al. | |
| 5,543,208 A | * | 8/1996 | Hasler | H01C 7/006 174/261 |
| 5,733,669 A | * | 3/1998 | Veyhl | H01C 7/006 338/308 |
| 5,994,996 A | * | 11/1999 | Van Den Broek | H01C 17/06553 252/521.3 |
| 2001/0024865 A1 | | 9/2001 | Kretschmann et al. | |
| 2014/0110160 A1 | | 4/2014 | Banba et al. | |

FOREIGN PATENT DOCUMENTS

| | | |
|---|---|---|
| JP | 2001318014 A | 11/2001 |
| JP | 2005191206 A | 7/2005 |
| JP | 2005294612 A | 10/2005 |
| JP | 2006140296 A | 6/2006 |
| JP | 2006313785 A | 11/2006 |
| WO | WO 2013002308 A1 | 1/2013 |

OTHER PUBLICATIONS

Written Opinion of the International Searching Authority issued for PCT/JP2015/072448, date of mailing Oct. 27, 2015.

* cited by examiner

ELECTRONIC COMPONENT AND METHOD FOR MANUFACTURING ELECTRONIC COMPONENT

CROSS REFERENCE TO RELATED APPLICATIONS

The present application is a continuation of International application No. PCT/JP2015/072448, filed Aug. 7, 2015, which claims priority to Japanese Patent Application No. 2014-165801, filed Aug. 18, 2014, the entire contents of each of which are incorporated herein by reference.

FIELD OF THE INVENTION

The present invention relates to an electronic component that includes a thin-film resistive element and to a method of manufacturing the electronic component.

BACKGROUND OF THE INVENTION

Conventionally, various electronic components that include a thin-film resistive element have been provided (for example, refer to Patent Document 1). For example, a thin-film resistive element of an electronic component 500 of the related art illustrated in FIG. 3 includes a plurality of resistive thin films 502 and connection electrodes 503. The plurality of resistive thin films 502 are formed on an insulating layer 501 and have Ni, Cr and Si as main components. The connection electrodes 503 are formed on the resistive thin films and have Ni as a main component. The thin-film resistive element is connected to the outside via Au/Pd outer electrodes 504 formed on the connection electrodes 503.

Patent Document 1: Japanese Unexamined Patent Application Publication No. 2001-31.8014 (paragraph 0005, FIG. 2 etc.)

SUMMARY OF THE INVENTION

As illustrated in FIG. 3, an increase in the resistance between the thin-film resistive element (resistive thin films 502) and the outer electrodes 504 is suppressed by connecting the resistive thin films 502 and the outer electrodes 504 to each other via the connection electrodes 503. Therefore variations in the resistance of the thin-film resistive element measured between the outer electrodes 504 are reduced. However, if the resistive thin films 502 are formed so as to have a comparatively large resistance value, there is a risk that the contact resistance between the resistive thin films 502 and the connection electrodes 503 will increase. In this case, it will not be possible to form a thin-film resistive element having the desired resistance value.

The present invention was made in light of the above-described problem and it is an object thereof to provide an electronic component that includes a thin-film resistive element that has a desired resistance and a method of manufacturing the electronic component.

In order to achieve the above-described object, the present invention provides an electronic component that includes a thin-film resistive element that includes a resistive thin film having Ni, Cr and Si as main components and a connection electrode that is electrically connected to the resistive thin film and has Ni as a main component. The Ni concentration in the resistive thin film at a side where there is a connection interface with the connection electrode is higher than the Ni concentration at a side opposite to the interface.

In the invention having the above-described configuration, the Ni concentration of the resistive thin film at the side where there is the connection interface with the connection electrode is higher than the Ni concentration of the resistive thin film at the side opposite to the interface. As a result, the work function of the resistive thin film at the side where there is the connection interface with the connection electrode and the work function of the connection electrode can be made to be close to each other. Consequently, a contact resistance caused by a difference in work function at the connection interface between the resistive thin film and the connection electrode can be prevented from increasing. Therefore, it is possible to provide an electronic component that includes a thin-film resistive element having a desired resistance value due to the design of a resistive thin film.

In addition, it is preferable that the resistive thin film contain 50 wt % or higher and 90 wt % or lower of Si.

With this configuration, since the resistivity of the resistive thin film increases as the Si content of the resistive thin film increases, a thin-film resistive element having a high resistance value can be formed. Furthermore, since the contact resistance at the connection interface between the resistive thin film and the connection electrode is prevented from increasing, a thin-film resistive element can be formed that is accurately given a prescribed high resistance value by setting the resistance value of the resistive thin film to a prescribed high resistance value.

In addition, it is preferable that resistivity of the resistive thin film be $10^{-5}$ Ωm or higher and $10^{-1}$ Ωm or lower.

With this configuration, an electronic component that includes a thin-film resistive element that has a practical resistance value can be provided.

In addition, it is preferable that the electronic component further include first to fourth outer electrodes, a variable-capacitance-type thin-film capacitor element that is serially connected between the first and second outer electrodes, a first thin-film resistive element, one end of which is connected to the third outer electrode, and a second thin-film resistive element, one end of which is connected to the fourth outer electrode. Other ends of the first and second thin-film resistive elements are respectively connected to the two ends of the thin-film capacitor element such that the thin-film capacitor element is inserted between the other ends of the first and second thin-film resistive elements.

With this configuration, an electronic component can be provided that includes a variable-capacitance-type thin-film capacitor element in which first and second outer electrodes serve as input/output terminals. That is, the capacitance of the thin-film capacitor element can be adjusted by arbitrarily adjusting the voltage applied to the two ends of the thin-film capacitor element via the first and second thin-film resistive elements by adjusting the voltage between the third and fourth outer electrodes.

In addition, the present invention provides a method of manufacturing an electronic component that includes a thin-film resistive element that includes a resistive thin film having Ni, Cr and Si as main components and a connection electrode that is electrically connected to the resistive thin film and has Ni as a main component, the method including forming the resistive thin film by causing a vapor deposition material composed of a mixture having Ni, Cr and Si as main components to be vapor deposited onto a resin layer by causing the vapor deposition material to evaporate or sublimate using one evaporation source.

In the thus-configured invention, the concentration of Ni, which has the highest evaporation temperature, increases as deposition of the resistive thin film progresses by causing the vapor deposition material composed of the mixture having Ni, Cr and Si as main components to evaporate or sublimate using one evaporation source. Consequently, the concentration of Ni inside the deposited film gradually increases as deposition of the resistive thin film progresses. Therefore, it is possible to easily form, on the resin layer, a resistive thin film in which the Ni concentration gradually increases toward the surface layer side on which the connection electrode is formed. Therefore, it is possible to easily manufacture an electronic component that includes a thin-film resistive element having a desired resistance value due to the design of a resistive thin film.

According to the present invention, by making the work function of the resistive thin film at the side where there is the connection interface with the connection electrode and the work function of the connection electrode be close to each other in order to prevent the contact resistance at the connection interface between the resistive thin film and the connection electrode from increasing. Thereby an electronic component can be provided that includes a thin-film resistive element having a desired resistance value due to the design of the resistive thin film. Furthermore, by forming a resistive thin film by causing a vapor deposition material composed of a mixture of all of the materials that are to form the resistive thin film to evaporate or sublimate using one evaporation source, it is possible to easily manufacture an electronic component that includes a thin-film resistive element having a desired resistance value due to the design of the resistive thin film.

DETAILED DESCRIPTION OF THE PREFERRED EMBODIMENTS

Figure 1:
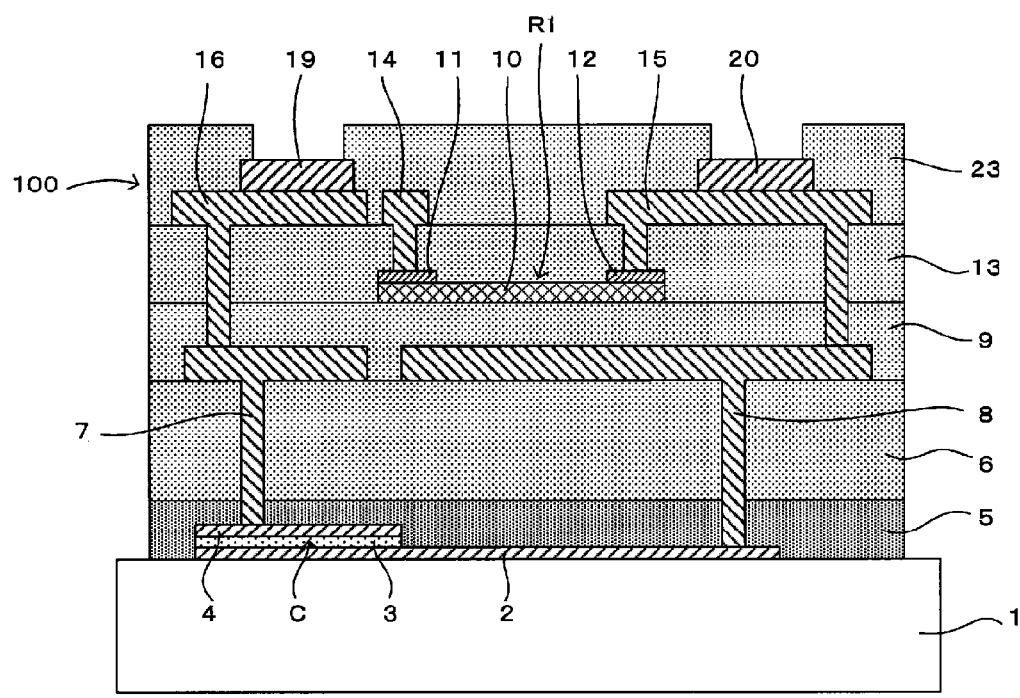
FIG. 1 is a sectional view of an electronic component according to an embodiment of the present invention.
Figure 2:
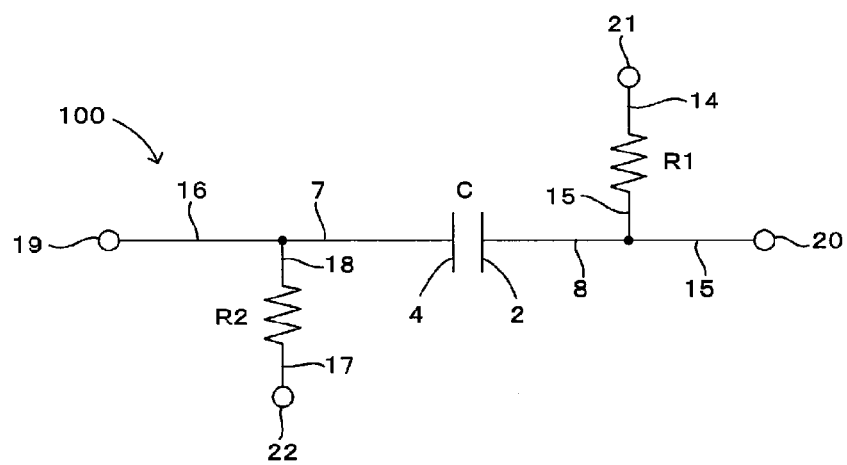
FIG. 2 illustrates an equivalent circuit of the electronic component of FIG. 1.
Figure 3:
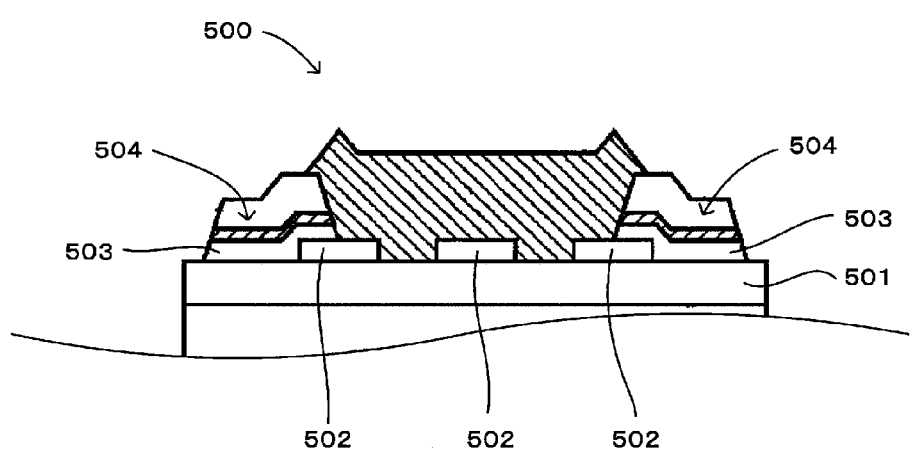
FIG. 3 illustrates an electronic component of the related art.

An embodiment of the present invention will be described while referring to FIGS. 1 and 2. FIG. 1 is a sectional view of an electronic component according to an embodiment of the present invention and FIG. 2 illustrates an equivalent circuit of the electronic component of FIG. 1. In order to simply the explanation, illustration of a thin-film resistive element R2, third and fourth outer electrodes 21 and 22 and lead-out electrodes 17 and 18 is omitted from FIG. 1.

(Configuration)

An outline configuration of an electronic component 100 will be described.

The electronic component 100 includes one variable-capacitance-type thin-film capacitor element C and first and second thin-film resistive elements R1 and R2 (corresponding to "thin-film resistive element" of present description). The one variable-capacitance-type thin-film capacitor element C is provided on an insulating substrate 1 which is for example a glass substrate, a ceramic substrate, a resin substrate or a Si substrate.

The thin-film capacitor element C includes a capacitor electrode layer 2 formed of a Pt thin film in a prescribed area on one surface of the insulating substrate 1, a (Ba, Sr)TiO$_3$ (hereafter "BST") dielectric layer 3, and a capacitor electrode layer 4 formed of a Pt thin film on the BST dielectric layer 3.

In addition, the thin-film capacitor element C is covered by a protective layer 5 that is formed of a SiO$_2$ moisture-resistant protective film and a resin layer 6 is stacked on top of the protective layer 5. Furthermore, a Cu/Ti lead-out electrode 7 and a Cu/Ti lead-out electrode 8 are formed on the upper surface of the resin layer 6. The Cu/Ti lead-out electrode 7 is connected to the upper-side capacitor electrode layer 4 of the thin-film capacitor element C via a through hole formed in the protective layer 5 and the resin layer 6. The Cu/Ti lead-out electrode 8 is connected to the lower-side capacitor electrode layer 2 of the thin-film capacitor element C. In addition, a resin layer 9 that covers the lead-out electrodes 7 and 8 is stacked on top of the resin layer 6.

The first thin-film resistive element R1 includes a resistive thin film 10 and connection electrodes 11 and 12. The resistive thin film 10 is formed in a prescribed area on one surface of the resin layer 9 and has Ni, Cr and Si as main components. The connection electrodes 11 and 12 are formed on the resistive thin film 10 and are electrically connected to the resistive thin film 10. The connection electrodes 11 and 12 are formed of a Cr-containing thin film that has Ni as a main component. In this embodiment, the mixing ratio of Ni, Cr and Si in the resistive thin film 10 is adjusted to a weight ratio of 1:2:7. In other words, the average composition ratio (weight ratio) of the entire resistive thin film 10 is adjusted to Ni:Cr:Si=1:2:7. The mixing ratio of Ni and Cr in the connection electrodes 11 and 12 is adjusted to a weight ratio of 8:2.

In addition, in this embodiment, the resistive thin film 10 is formed such that the concentration of Ni inside the resistive thin film 10 gradually increases from the lower surface side that closely contracts the resin layer 9 to the upper surface side on which the connection electrodes 11 and 12 are formed. Therefore, there is a Ni concentration gradient in the thickness direction of the resistive thin film 10 and the Ni concentration of the resistive thin film 10 at the side where there is the connection interface with the connection electrodes 11 and 12, the connection electrodes 11 and 12 having Ni as a main component, is higher than at the opposite side to the interface.

One end of the first thin-film resistive element R1 is the connection electrode 11 and the other end of the first thin-film resistive element R1 is the connection electrode 12. The second thin-film resistive element R2 is formed on the resin layer 9, similarly to the first thin-film resistive element R1. In this embodiment, the two thin-film resistive elements R1 and R2 are both formed on the resin layer 9, but the first and second thin-film resistive elements R1 and R2 may be instead formed on different resin layers.

In addition, the first and second thin-film resistive elements R1 and R2 are covered by a resin layer 13 stacked on top of the resin layer 9. Furthermore, a Cu/Ti lead-out electrode 14 is formed on an upper surface of the resin layer 13. The Cu/Ti lead-out electrode 14 is connected to the one end (connection electrode 11) of the first thin-film resistive element R1 via a through hole formed in the resin layer 13. In addition, a Cu/Ti lead-out electrode 15 is formed on the upper surface of the resin layer 13. The Cu/Ti lead-out electrode 15 connects the other end (connection electrode 12) of the first thin-film resistive element R1 and the lead-out electrode 8 (capacitor electrode layer 2) to each other via through holes formed in the resin layers 9 and 13.

Furthermore, a Cu/Ti lead-out electrode 16 is formed on the upper surface of the resin layer 13. The Cu/Ti lead-out electrode 16 is connected to the lead-out electrode 7 (capacitor electrode layer 4) via a through hole formed in the resin layers 9 and 13. In addition, although illustration thereof is omitted from FIG. 1, a Cu/Ti lead-out electrode 17 is formed so as to be connected to one end (connection electrode 11) of the second thin-film resistive element R2 via a through hole formed in the resin layer 13. Furthermore, although illustration thereof is omitted from FIG. 1, a Cu/Ti lead-out electrode 18 is formed so as to connect the other end (connection electrode 12) of the second thin-film resistive element R2 and the lead-out electrode 7 (capacitor electrode layer 4) to each other via through holes formed in the resin layers 9 and 13.

In addition, a Au first outer electrode 19 is formed on the lead-out electrode 16 and a Au second outer electrode 20 is formed on the lead-out electrode 15. Furthermore, although illustration thereof is omitted from FIG. 1, a third outer electrode 21 is formed on the lead-out electrode 14 and a fourth outer electrode 22 is formed on the lead-out electrode 17. A protective layer 23 is stacked on top of the resin layer 13. The protective layer 23 is formed of resin so as to cover the lead-out electrodes 14 to 18 and edge portions of the outer electrodes 19 to 22.

In the thus-formed electronic component 100, the thin-film capacitor element C is serially connected between the first and second outer electrodes 19 and 20, as illustrated in FIG. 2. In addition, the other ends of the first and second thin-film resistive elements R1 and R2 are respectively connected to the two ends of the thin-film capacitor element C such that the thin-film capacitor element C is inserted between the other end of the first thin-film resistive element R1 and the other end of the second thin-film resistive element R2. The one end of the first thin-film resistive element R1 is connected to the third outer electrode 21, and the one end of the second thin-film resistive element R2 is connected to the fourth outer electrode 22. Specifically, the other end (connection electrode 12) of the thin-film resistive element R1 is connected to one end (capacitor electrode layer 2) of the thin-film capacitor element C, and the other end (connection electrode 12) of the thin-film resistive element R2 is connected to the other end (capacitor electrode layer 4) of the thin-film capacitor element C. Accordingly, the thin-film capacitor element C is inserted between the other ends of the first and second thin-film resistive elements R1 and R2.

(Manufacturing Method)

An example of a method of manufacturing the electronic component 100 will be described. In this embodiment, the plurality of the electronic components 100 are formed on the large-area insulating substrate 1, and then the plurality of electronic components 100 are divided into individual components.

First, the lower-side capacitor electrode layers 2, the dielectric layers 3 and the upper-side capacitor electrode layers 4 are formed in prescribed areas on the insulating substrate 1 to form the thin-film capacitor elements C. Then the protective layer 5, which covers the thin-film capacitor elements C, is formed. Next, the resin layer 6 is formed and a heat treatment (320° C., 30 mins, $N_2$ atmosphere) is performed to harden the resin layer 6. The resin layer 6 is composed of a polybenzoxazole-based photosensitive insulating film and through holes are formed in the resin layer 6 by photolithography.

Next, a $SiO_2$ moisture-resistant protective film inside the through holes of the resin layer 6 is removed by dry etching and a Ti film and a Cu film, which will form the lead-out electrodes 7 and 8, are deposited using a sputtering method. Then, the lead-out electrodes 7 and 8 are formed by performing patterning by carrying out etching using photolithography. Next, the resin layer 9, which is composed of a phenol-based photosensitive insulating film, is formed and a heat treatment is performed in order to harden the resin layer (200° C., 60 mins, $N_2$ atmosphere).

Next, the resistive thin films 10 are formed by vapor deposition using a lift-off technique by forming a lift-off resist and evaporating or sublimating a vapor deposition material composed of a mixture having Ni, Cr and Si as main components using a single evaporation source. Next, a lift-off resist is formed and the connection electrodes 11 and 12 containing Ni and Cr are formed by vapor deposition using a lift-off technique.

Next, the resin layer 13, which is composed of a phenol-based photosensitive insulating film in which through holes are formed by photolithography, is formed and a heat treatment (200° C., 60 mins, $N_2$) is performed in order to harden the resin layer. Then, a Ti film and a Cu film, which will form the lead-out electrodes 14 to 18, are deposited using a sputtering method.

Next, a resist in which openings are provided at prescribed positions above the formed Cu/Ti films is formed by patterning and the first to fourth outer electrodes 19 to 22 are formed at the prescribed positions on the Cu/Ti films 19 to 22 by using a plating method. Then, the lead-out electrodes 14 to 18 are formed by removing the resist and then patterning the Cu/Ti films by performing etching with photolithography.

Then, the protective layer 23 is formed of a resin composed of a phenol-based photosensitive insulating film in which outer electrode exposing portions are formed by photolithography and a heat treatment is performed in order to harden the resin layer. Then, cutting is performed with a dicing machine to obtain the individual electronic components 100. Thus, the electronic component 100 is completed.

The thus-formed electronic component 100 is used as a variable capacitance element with the first and second outer electrodes 19 and 20 serving as input/output terminals by being mounted by using solder, wire bonding or the like on another wiring substrate, for example. That is, the capacitance of the thin-film capacitor element C can be adjusted by arbitrarily adjusting the voltage applied to the two ends of the thin-film capacitor element C via the first and second thin-film resistive elements R1 and R2 by adjusting the voltage between the third and fourth outer electrodes 21 and 22.

As described above, in this embodiment, a concentration gradient is provided such that there is a larger amount of Ni in the resistive thin film 10 at the side where there is the connection interface with the connection electrodes 11 and 12 than at the side of the resistive thin film 10 opposite to the interface. Therefore, the work function of the resistive thin film 10 at the side of the connection interface with the connection electrodes 11 and 12 and the work function of the connection electrodes 11 and 12 having Ni as a main component can be made to be close to each other by increasing the Ni concentration at the interface while securing high resistivity for the resistor pattern by maintaining the average composition ratio in the resistive thin film 10. "Work function" refers to the smallest amount of energy necessary to extract an electron from a surface and the energy barrier of an interface becomes smaller as the difference in work function becomes smaller. Consequently, a contact resistance caused by a difference in work function at the connection interface between the resistive thin film 10 and the connection electrodes 11 and 12 can be prevented from increasing. Therefore, it is possible to provide the electronic component 100 that includes the first and second thin-film resistive elements R1 and R2 having desired resistance values due to the design of the resistive thin film 10. It is preferable that the difference between the Ni concentration of the resistive thin film 10 at the side of the connection interface with the connection electrodes 11 and 12 and the Ni concentration of the resistive thin film 10 at the side opposite to the interface be on the order of 0.05 to 3 wt % taking into consideration the balance between the contact resistance at the connection interface and the high resistivity of the entirety of the connection electrodes.

In addition, since the resistivity of the resistive thin film 10 increases as the Si content of the resistive thin film 10 increases, first and second thin-film resistive elements R1 and R2 having high resistance values can be formed. But in this embodiment, the contact resistance at the connection interface between the resistive thin film 10 and the connection electrodes 11 and 12 is prevented from increasing. Therefore, by setting the resistance value of the resistive thin film 10 to a prescribed high resistance value, first and second thin-film resistive elements R1 and R2 that have been accurately given a prescribed high resistance value can be formed. It is preferable that the resistive thin film 10 contain 50 wt % or higher and 90 wt % or lower of Si in order to be formed with a high resistance value.

Furthermore, an electronic component 100 can be provided that includes first and second thin-film resistive elements R1 and R2 having practical resistance values by setting the resistivity of the resistive thin film 10 to be $10^{-5}$ Ωm or higher and $10^{-1}$ Ωm or lower.

In addition, the concentration of Ni, which has the highest evaporation temperature (Ni:1510° C., Cr:1205° C., Si:1343° C.; temperatures at vapor pressure of 1 Pa), increases as deposition of the resistive thin film 10 progresses in a method in which a vapor deposition material composed of a mixture having Ni, Cr and Si as main components is evaporated or sublimated using a single evaporation source (one-source vacuum vapor deposition method). Consequently, the concentration of Ni inside the deposited film gradually increases as deposition of the resistive thin film 10 progresses. Therefore, it is possible to easily form, on the resin layer 9, the resistive thin film 10 in which the Ni concentration gradually increases toward the upper surface side on which the connection electrodes 11 and 12 are formed. Therefore, it is possible to easily manufacture the electronic component 1 that includes the first and second thin-film resistive elements R1 and R2 having desired resistance values due to the design of the resistive thin film 10.

Furthermore, the resistive thin film 10, which is formed of a plurality of metal components, can be formed without the use of multiple vapor deposition sources. In addition, the resistive thin film 10 is formed by vapor deposition using a lift-off technique. Therefore, the resistive thin film 10 having high pattern accuracy can be formed at low cost.

An increase in the contact resistance at the connection interface between the resistive thin film 10 and the connection electrodes 11 and 12 could also be suppressed by increasing the Ni concentration at the side of the resistive thin film 10 where there is the connection interface with the connection electrodes 11 and 12. The Ni concentration could be increased by performing a heat treatment after forming the connection electrodes 11 and 12 on the resistive thin film 10 and causing the Ni component in the connection electrodes 11 and 12 to diffuse into the inside of the resistive thin film 10. However, there is a possibility that the resin layers 6 and 9 would be damaged by being heated at a high temperature and it would be necessary for the manufacturing process to be managed so as not to damage the resin layers 6 and 9. In addition, a high-temperature process would be necessary. Therefore, the cost of manufacturing the electronic component 1 would increase.

On the other hand, in this embodiment, the resistive thin film 10 is formed in a state where a gradient is generated in the concentration distribution of Ni (metal component) inside the film without the use of a high-temperature process by forming the resistive thin film 10 by using a single-source vacuum vapor deposition method. Therefore, since a heating process such as one causing dispersion after deposition of the resistive thin film is not necessary, the resistive thin film 10 having a concentration gradient can be formed on one surface of the resin layer 9 without causing the manufacturing cost to increase.

The present invention is not limited to the above-described embodiment and can be modified in various ways not described above so long as they do not depart from the gist of the invention. For example, a plurality of thin-film capacitor elements C may be serially connected between the first and second outer electrodes 19 and 20. In this case, the first thin-film resistive element R1 and/or the second thin-film resistive element R2 should be appropriately added in a necessary number so that each one thin-film capacitor element C is inserted between the other ends of first and second thin-film resistive elements R1 and R2. Furthermore, the one end of an added first thin-film resistive element R1 should be connected to the third outer electrode 21 and the one end of an added second thin-film resistive element R2 should be connected to the fourth outer electrode 22.

In addition, an electronic component may be formed of just the thin-film resistive element. Furthermore, electronic components can be provided in which various circuits are formed by appropriately combining a thin film circuit element such as a thin-film capacitor element, a thin film inductor element or a thin film thermistor element with a thin-film resistive element. In this case, it is sufficient that the thin-film capacitor element, the thin film inductor element or the thin film thermistor element have the configuration of a typical thin film circuit element.

Furthermore, the resistive thin film 10 may be formed such that the Ni concentration inside the resistive thin film 10 gradually increases from the side opposite to the side of the connection interface between the resistive thin film 10 and the connection electrodes 11 and 12 toward the side of the connection interface by using multiple evaporation sources.

In addition, the dielectric material forming the dielectric layer is not limited to the above-described example. For example, the dielectric layer may be formed of a dielectric material such as $BaTiO_3$, $SrTiO_3$ or $PbTiO_3$.

The present invention can be widely applied to electronic components that include a thin-film resistive element and to methods of manufacturing such electronic components.

EXPLANATION OF REFERENCE NUMERALS 9 resin layer
10 resistive thin film
11, 12 connection electrode
19 first outer electrode
20 second outer electrode
21 third outer electrode
22 fourth outer electrode
100 electronic component
C thin-film capacitor element R1 first thin-film resistive element (thin-film resistive element)
R2 second thin-film resistive element (thin-film resistive element)

The invention claimed is:

1. A resistive element comprising:
a resistive film having Ni, Cr and Si as main components thereof; and
a connection electrode electrically connected to the resistive film, the connection electrode having Ni as a main component,
wherein a first Ni concentration in the resistive film at a first side thereof having a connection interface with the connection electrode is higher than a second Ni concentration at a second side opposite to the first side.

2. The resistive element according to claim 1, wherein the resistive film contains 50 wt % to 90 wt % of Si.

3. The resistive element according to claim 2, wherein a resistivity of the resistive film is $10^{-5}$ Ωm to $10^{-1}$ Ωm.

4. The resistive element according to claim 1, wherein a resistivity of the resistive film is $10^{-5}$ Ωm to $10^{-1}$ Ωm.

5. The resistive element according to claim 1, wherein a ratio of the Ni, the Cr and the Si in the resistive film is 1:2:7 by weight.

6. The resistive element according to claim 5, wherein the connection electrode further includes Cr, and a ratio of the Ni and the Cr in the connection electrode is 8:2 by weight.

7. The resistive element according to claim 1, wherein the connection electrode further includes Cr.

8. The resistive element according to claim 7, wherein a mixing ratio of the Ni and the Cr in the connection electrode is 8:2 by weight.

9. An electronic component comprising:
first to fourth outer electrodes;
a variable-capacitance film capacitor element serially connected between the first and second outer electrodes;
a first resistive element, a first end of which is connected to the third outer electrode, and a second end of which is connected to the variable-capacitance film capacitor; and
a second resistive element, a third end of which is connected to the fourth outer electrode, and a fourth end of which is connected to the variable-capacitance film capacitor,
wherein at least one the first resistive element and the second resistive element is the resistive element according to claim 1.

10. The electronic component according to claim 9, wherein the resistive film contains 50 wt % to 90 wt % of Si.

11. The electronic component according to claim 9, wherein a resistivity of the resistive film is $10^{-5}$ Ωm to $10^{-1}$ Ωm.

12. The electronic component according to claim 9, wherein a ratio of the Ni, the Cr and the Si in the resistive film is 1:2:7 by weight.

13. A method of manufacturing a resistive element, the method comprising:
forming a resistive film by vapor depositing a mixture having Ni, Cr and Si as main components onto a resin layer;
forming a connection electrode on the resistive film, the connection electrode having Ni as a main component; and
causing the vapor deposited material to evaporate or sublimate using an evaporation source such that a first Ni concentration in the resistive film at a first side thereof having a connection interface with the connection electrode is higher than a second Ni concentration at a second side opposite to the first side.

14. The method of manufacturing a resistive element according to claim 13, wherein the resistive film contains 50 wt % to 90 wt % of Si.

15. The method of manufacturing a resistive element according to claim 14, wherein a resistivity of the resistive film is $10^{-5}$ Ωm to $10^{-1}$ Ωm.

16. The method of manufacturing a resistive element according to claim 13, wherein a resistivity of the resistive film is $10^{-5}$ Ωm to $10^{-1}$ Ωm.

17. The method of manufacturing a resistive element according to claim 13, wherein a ratio of the Ni, the Cr and the Si in the resistive film is 1:2:7 by weight.

18. The method of manufacturing a resistive element according to claim 17, wherein the connection electrode further includes Cr, and a ratio of the Ni and the Cr in the connection electrode is 8:2 by weight.

* * * * *